Figure 1:
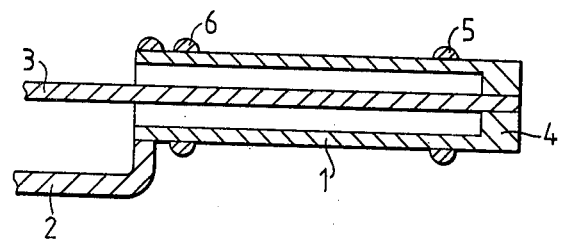

United States Patent [19]

Carson et al.

[11] 4,322,710
[45] Mar. 30, 1982

[54] ELECTRICAL RESISTORS

[75] Inventors: Richard G. Carson, Edinburgh; Frank B. McCall, Balerno; Alistair J. Stanley, Aberlady, all of Scotland

[73] Assignee: Ferranti Limited, Gatley, England

[21] Appl. No.: 174,661

[22] Filed: Aug. 1, 1980

[30] Foreign Application Priority Data

Aug. 2, 1979 [GB] United Kingdom ............... 26895/79

[51] Int. Cl.³ ............................................. H01C 3/02
[52] U.S. Cl. ..................................... 338/61; 338/272; 338/276; 338/332
[58] Field of Search .................... 338/61, 30, 271, 272, 338/276, 332, 333, 334; 174/32, 33; 336/82

[56] References Cited

U.S. PATENT DOCUMENTS

| 2,337,202 | 12/1943 | Jones | 338/30 |
| 2,568,600 | 9/1951 | Wirk | 338/61 X |
| 3,514,735 | 5/1970 | Nijo | 338/30 X |

FOREIGN PATENT DOCUMENTS

| 233048 | 3/1909 | Fed. Rep. of Germany | 338/30 |
| 272751 | 4/1914 | Fed. Rep. of Germany | 338/61 |

Primary Examiner—C. L. Albritton
Attorney, Agent, or Firm—Kerkam, Stowell, Kondracki & Clarke

[57] ABSTRACT

An electrical resistor comprises a tube of resistive material having a closed end. An electrical connection is made to the open end of the cylinder, and a further connection comprises a conductor passing through the open end of the cylinder and connected to the closed end. A pair of voltage-measuring connections are made to the outer surface of the cylinder.

6 Claims, 2 Drawing Figures

ELECTRICAL RESISTORS

This invention relates to electric resistors and in particular to current sensing resistors.

Current sensing resistors are used whenever it is required to measure the value of a large current by determining the voltage drop produced by the flow of current through a known resistance. In applications where a very low value of resistance is required to enable a large current to be measured at high frequencies, then the self-inductance of a normal resistor becomes possible source of error. Normal so-called "non-inductive" resistors are wound with balanced or bifilar windings, and usually have too high a resistance to be suitable for this purpose. The use of current transformers is expensive and introduces losses.

It is an object of the invention to provide a simple and inexpensive current-sensing resistor having little or no inductance between a pair of voltage measuring connections.

According to the present invention there is provided an electrical resistor which includes a self-supporting hollow cylinder of resistive material having one end closed, a first electrical connection to the open end of the cylinder, a second electrical connection in the form of a conductor passing through the open end of the cylinder and connected to the closed end thereof, and a pair of spaced voltage-measuring connections located on the outer surface of the cylinder.

Preferably the cylinder may be formed from a low-resistance material to provide a low resistance between the voltage measuring connections.

The cylinder need not necessarily be of circular cross-section.

Figure 2:
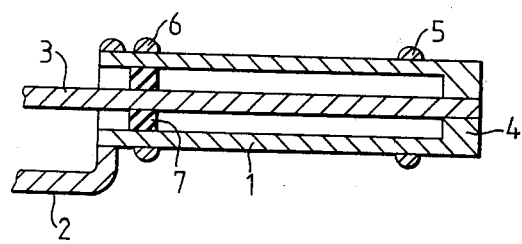

The invention will now be described with reference to the accompanying drawings, in which:

FIG. 1 shows a sectional side view of a resistor according to a first embodiment; and FIG. 2 illustrates a second embodiment.

Referring to FIG. 1 the resistor is made from a circular cylinder 1 of material having a suitable resistivity, with one end of the cylinder closed. A low resistance electrical connection 2 is made to the open end of the cylinder, preferably by wrapping a conductor around the end of the cylinder. A second low resistance electrical connection is made by passing a conductor 3 through the open end of the cylinder and connecting it to the closed end 4. Two voltage-measuring connections 5 and 6 are formed on the other surface of the cylinder either as point contacts or by wrapping conductors around the outer surface of the cylinder. As shown in FIG. 2, the conductor 3 may be supported by a suitable insulator 7 as it passes through the open end of the cylinder.

In use, so long as the same current flows in conductors 2 and 3 and in the cylinder 1, the net magnetic field outside the cylinder will be zero. Hence there is no inductive coupling with the cylinder 1, and the inductive component that would have been experienced by the cylinder alone is cancelled by the equal and opposite currents flowing in conductor 3 and cylinder 1. As a result the voltage measured between points 5 and 6 is measured across a pure resistance, and variations in frequency have no effect.

A resistor of the type described above has many applications, and may be made with any required resistance value. However, it is particularly useful for the measurement of high-frequency alternating currents. By way of example only, such a resistor may be used to measure the output current in an invertor, where the current may be of the order of 20 amps switched at 25 KHz. In such an instance, depending upon the scale factor of the instrument used to measure the voltage between points 5 and 6, a resistance of the order of 2 milliohms may be sufficient. The cylinder 1 may be made of copper or some other relatively low resistivity metal.

The material from which the cylinder is made may be chosen to have a low temperature co-efficient of resistance, or may be one which has a temperature coefficient which matches, or compensates, that of a circuit or components with which it is used. The centre conductor may be solid or standard, and the cylinder may be formed from a bundle of conductors laid side-by-side.

As already stated, any suitable resistance value may be provided, using a cylinder of a suitable material and of suitable dimensions. The cylinder may be of any cross-section.

What we claim is:

1. An electrical resistor which includes a self-supporting hollow cylinder of electrically resistive material having one end closed, a first electrical connection to the open end of the cylinder, a second electrical connection in the form of a conductor passing through the open end of the cylinder and connected to the closed end thereof, and a pair of spaced voltage-measuring connections located on the outer surface of the cylinder.

2. A resistor as claimed in claim 1 in which the cylinder is made from a low resistance material to provide a low resistance between the two voltage-measuring connections.

3. A resistor as claimed in claim 1 in which the first electrical connection is formed by a conductor wrapped around the open end of the cylinder.

4. A resistor as claimed in claim 1 in which the conductor forming the second electrical connection is spaced from the inner surface of the cylinder by at least one insulator.

5. A resistor as claimed in claim 4 in which the insulator comprises an insulating layer formed around the conductor and supporting the electrically-resistive cylinder.

6. A resistor as claimed in claim 1 in which each voltage-measuring connection is formed by wrapping a conductor around the outer surface of the cylinder.

* * * * *